United States Patent
Wang et al.

(10) Patent No.: US 10,659,013 B2
(45) Date of Patent: May 19, 2020

(54) CURRENT-CONTROLLED OSCILLATOR WITH START-UP CIRCUIT

(71) Applicant: NXP USA, INC., Austin, TX (US)

(72) Inventors: Yang Wang, Suzhou (CN); Jianzhou Wu, Suzhou (CN); Jie Jin, Suzhou (CN); Jiawei Fu, Suzhou (CN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/237,727

(22) Filed: Jan. 1, 2019

(65) Prior Publication Data

US 2019/0222201 A1 Jul. 18, 2019

(30) Foreign Application Priority Data

Jan. 17, 2018 (CN) .......................... 2018 1 0047469

(51) Int. Cl.

| | |
|---|---|
| *H03K 3/014* | (2006.01) |
| *H03L 7/099* | (2006.01) |
| *H03L 3/00* | (2006.01) |
| *H03K 3/03* | (2006.01) |
| *G05F 3/26* | (2006.01) |

(52) U.S. Cl.
CPC .......... *H03K 3/014* (2013.01); *H03K 3/0315* (2013.01); *H03L 3/00* (2013.01); *H03L 7/0995* (2013.01); *G05F 3/262* (2013.01)

(58) Field of Classification Search
CPC .. H03K 3/0315; H03K 3/0322; H03K 7/0995; H03K 3/014; H03L 3/00
See application file for complete search history.

(56) References Cited

U.S. PATENT DOCUMENTS

| | | |
|---|---|---|
| 5,844,444 A | 12/1998 | Wu et al. |
| 6,057,721 A | 5/2000 | Nolan et al. |
| 6,252,467 B1 * | 6/2001 | Yoshimura ........... H03K 3/0322 331/175 |
| 6,400,207 B1 | 6/2002 | Ivanov et al. |
| 6,803,833 B2 * | 10/2004 | Yen ...................... H03K 3/0231 327/142 |
| 7,639,097 B2 | 12/2009 | Tran |

(Continued)

OTHER PUBLICATIONS

De Heyn, Vincent, et al. "A fast start-up 3GHz-10GHz digitally controlled oscillator for UWB impulse radio in 90nm CMOS." ESSCIRC 2007—33rd European Solid-State Circuits Conference. IEEE, 2007. (Year: 2007).*

*Primary Examiner* — Ryan Johnson

(57) ABSTRACT

A start-up circuit for a ring current-controlled oscillator (CCO) includes a replica CCO current generator, a replica ring CCO, and a buffer. The ring CCO is connected to a CCO driver and the buffer. The CCO driver generates a CCO current based on a reference current. The ring CCO generates a CCO output voltage at a first oscillating frequency based on the CCO current. The replica CCO current generator generates a replica CCO current based on a reference voltage. The replica ring CCO generates a replica CCO output voltage at a second oscillating frequency based on the replica CCO current. The buffer provides a first current to the ring CCO when the first oscillating frequency is lower than a desired oscillating frequency, and drains a second current from the ring CCO when the first oscillating frequency is greater than the desired oscillating frequency.

20 Claims, 3 Drawing Sheets

(56) References Cited

U.S. PATENT DOCUMENTS

| | | |
|---|---|---|
| 8,358,175 B2 | 1/2013 | Mahooti et al. |
| 9,007,138 B2 | 4/2015 | Muller et al. |
| 9,733,662 B2 | 8/2017 | Mahooti et al. |
| 10,305,454 B2 * | 5/2019 | Khare ................. H03K 3/0315 |
| 2005/0206466 A1 * | 9/2005 | Sohn ..................... G11C 7/222 |
| | | 331/185 |

* cited by examiner

CURRENT-CONTROLLED OSCILLATOR WITH START-UP CIRCUIT

BACKGROUND

The present invention generally relates to electronic circuits, and more particularly, to a start-up circuit for a current-controlled oscillator.

Most digital circuits use clock signals to synchronize various functions performed by the digital circuits. To generate the clock signals at desired oscillating frequencies, the digital circuits typically employ a clock generating circuit such as a current-controlled oscillator (CCO). The CCO includes series connected inverters that are controlled by a driving current for generating an output voltage at a desired oscillating frequency, where the oscillating frequency is directly proportional to the driving current. For example, when the driving current is high, the oscillating frequency is high, and when the driving current is low, the oscillating frequency is low.

The CCO includes a start-up circuit that generates the driving current. Existing start-up circuits include a high-gain reference circuit and a current generator. The current generator supplies a start-up current to the high-gain reference circuit, which in turn amplifies the start-up current. The high-gain reference circuit also generates the start-up current used to control the oscillating frequency of the output voltage of the CCO.

Digital circuits usually operate at a high clock speed (typically in mega-Hertz), and the oscillating frequency of the output voltage should reach the desired oscillating frequency within a short time period (typically in microseconds). Further, the CCO needs to generate the output voltage at the desired oscillating frequency within this time period to sample data correctly. Thus, to achieve the desired output voltage oscillating frequency, the driving current must reach a desired current within the short time period. However, the high-gain reference circuit cannot generate the driving current until the current generator supplies the start-up current to it, which impacts the start-up time of the ring CCO. Further, when the current generator supplies the start-up current, the high-gain reference circuit may generate a driving current that is less than desired. Hence, the CCO may fail to generate the output voltage at the desired oscillating frequency.

Conventional start-up circuits also employ current generators to generate a driving current that is greater than the desired current within the short time period. However, if the driving current overshoots the desired current, it causes the output voltage oscillating frequency to be greater than the desired oscillating frequency, which can cause the clock signal to incorrectly sample data. Hence, there is a need for a CCO with a start-up circuit that accurately generates the driving current for driving the CCO so that the CCO generates the output voltage at the desired oscillating frequency, and also has a faster start-up time.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
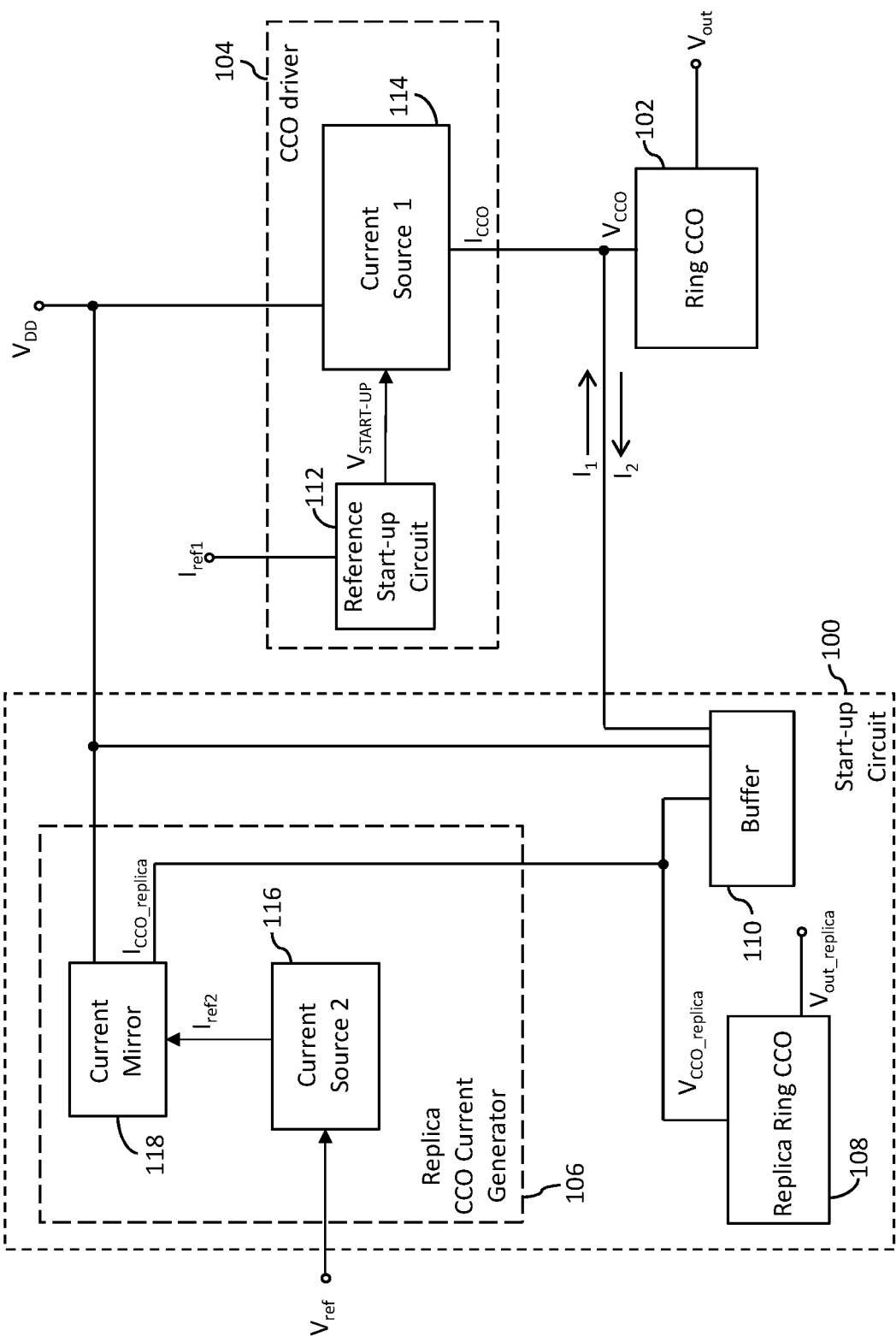
FIG. 1 is a schematic block diagram of a start-up circuit connected to a ring CCO in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a start-up circuit for a ring CCO. The ring CCO receives a CCO current. The start-up circuit includes a replica CCO current generator, a replica ring CCO, and a buffer. The replica CCO current generator receives a reference voltage and a supply voltage, and generates a replica CCO current. The replica ring CCO is connected to the replica CCO current generator and receives the replica CCO current. The replica ring CCO further generates a replica CCO output voltage at a first oscillating frequency that is less than a second oscillating frequency of a CCO output voltage of the ring CCO. The buffer is connected between the ring CCO and the replica ring CCO, and provides a first current to the ring CCO when the second oscillating frequency is lower than a desired oscillating frequency of the CCO output voltage, and drains a second current from the ring CCO when the second oscillating frequency is greater than the desired oscillating frequency.

In another embodiment, the present invention provides a system for generating a CCO output voltage at a first oscillating frequency. The system includes a ring CCO and a start-up circuit. The ring CCO receives a CCO current, and generates the CCO output voltage at the first oscillating frequency. The start-up circuit is connected to the ring CCO for controlling the first oscillating frequency. The start-up circuit includes a replica CCO current generator, a replica ring CCO, and a buffer. The replica CCO current generator receives a reference voltage and a supply voltage, and generates a replica CCO current. The replica ring CCO is connected to the replica CCO current generator for receiving the replica CCO current. The replica ring CCO further generates a replica CCO output voltage at a second oscillating frequency that is less than the first oscillating frequency. The buffer is connected between the ring CCO and the replica ring CCO, and provides a first current to the ring CCO when the first oscillating frequency is lower than a desired oscillating frequency of the CCO output voltage, and drains a second current from the ring CCO when the first oscillating frequency is greater than the desired oscillating frequency.

Various embodiments of the present invention provide a start-up circuit for a ring CCO. The start-up circuit includes a replica CCO current generator, a replica ring CCO, and a buffer. The ring CCO is connected to a CCO driver. The CCO driver includes a reference start-up circuit and a first current source. The reference start-up circuit receives a first reference current, and generates a start-up voltage. The first current source receives the start-up voltage and generates a CCO current and provides the CCO current to the ring CCO. The ring CCO generates a CCO output voltage at a first oscillating frequency based on the CCO current. The replica CCO current generator includes a second current source and a current mirror. The second current source receives a reference voltage and generates a second reference current. The current mirror receives the second reference current from the second current source, and generates a replica CCO current. The current mirror outputs the replica CCO current to the replica ring CCO. The replica ring CCO also generates a replica CCO output voltage at a second oscillating frequency based on the replica CCO current, where the second oscillating frequency is less than the first oscillating frequency. The buffer is connected between the ring CCO and the replica ring CCO, and provides a first current to the ring CCO when the first oscillating frequency is lower than a desired oscillating frequency of the CCO output voltage, and drains a second current from the ring CCO when the first oscillating frequency is greater than the desired oscillating frequency. The start-up circuit maintains the first oscillating frequency at the desired oscillating frequency. The start-up circuit performs at least one of increasing and decreasing the first oscillating frequency based on the first and second currents, respectively, thereby facilitating a fast start-up time for the ring CCO. The start-up circuit shuts down when the first oscillating frequency is equal to the desired oscillating frequency, which saves power. The start-up circuit replicates a CCO and a current generator circuit to drive the core CCO circuit, which improves the start-up time. The start-up circuit also prevents the CCO's oscillation frequency from overshooting by clamping the voltage at a node Vcco.

Referring now to FIG. 1, a schematic block diagram of a start-up circuit 100 that is connected to a ring current-controlled oscillator (CCO) 102 in accordance with an embodiment of the present invention is shown. The start-up circuit 100 and the ring CCO 102 together form a system for generating a CCO output voltage $V_{out}$ that has a first oscillating frequency, where the start-up circuit 100 controls the first oscillating frequency.

A CCO driver 104 is connected between the start-up circuit 100 and the ring CCO 102. The CCO driver 104 is connected to a voltage source (not shown) and receives a supply voltage $V_{DD}$. The CCO driver 104 is further connected to an off-chip current source (not shown) and receives a first reference current $I_{ref1}$. The CCO driver 104 generates a CCO current $I_{CCO}$ for driving the ring CCO 102, based on the first reference current $I_{ref1}$.

The start-up circuit 100 includes a replica CCO current generator 106, a replica ring CCO 108, and a buffer 110.

The CCO driver 104 includes a reference start-up circuit 112 and a first current source 114. The reference start-up circuit 112 receives the first reference current $I_{ref1}$ from the off-chip current source, and generates a start-up voltage $V_{START-UP}$ that is directly proportional to the first reference current $I_{ref1}$. The reference start-up circuit 112 may be a current to voltage conversion circuit such as a transimpedance amplifier.

The first current source 114 receives the start-up voltage $V_{START-UP}$ from the reference start-up circuit 112 and the supply voltage $V_{DD}$ from the voltage source, and generates the CCO current $I_{CCO}$, which is provided to the ring CCO 102. An embodiment of the first current source 114 will be described in greater detail with reference to FIG. 2. The CCO current $I_{CCO}$ is for regulating the first oscillating frequency.

The ring CCO 102 includes an odd number of series connected inverters. The ring CCO 102 operates based on a gate delay of the inverters. The higher the number of inverters in the ring CCO 102, the higher the gate delay. The ring CCO 102 is connected to the first current source 114, and receives the CCO current $I_{CCO}$. The ring CCO 102 generates the CCO output voltage $V_{out}$ at the first oscillating frequency, based on the CCO current $I_{CCO}$.

The replica CCO current generator 106 receives a reference voltage $V_{ref}$ from an off-chip voltage source, and the supply voltage $V_{DD}$, and generates a replica CCO current $I_{CCO\_replica}$. The replica CCO current generator 106 includes a second current source 116 and a current mirror 118. The second current source 116 receives the reference voltage $V_{ref}$, and, based on the reference voltage $V_{ref2}$ generates a second reference current $I_{ref2}$. The current mirror 118 receives the second reference current $I_{ref2}$ from the second current source 116, and the supply voltage $V_{DD}$, and generates the replica CCO current $I_{CCO\_replica}$ based on the second reference current $I_{ref2}$. The replica CCO current $I_{CCO\_replica}$ is provided to the replica ring CCO 108 for driving the replica ring CCO 108.

The replica ring CCO 108 is functionally similar to the ring CCO 102. The replica ring CCO 108 generates a replica CCO output voltage $V_{out\_replica}$ at a second oscillating frequency, based on the replica CCO current $I_{CCO\_replica}$.

The buffer 110 is connected between the ring CCO 102 and the replica ring CCO 108. The buffer 110 receives the supply voltage $V_{DD}$. The buffer 110 provides a first current $I_1$ to the ring CCO 102 when the first oscillating frequency is lower than a predetermined desired oscillating frequency of the CCO output voltage $V_{out}$. Further, the buffer 110 drains a second current $I_2$ from the ring CCO 102 when the first oscillating is greater than the predetermined desired oscillating frequency. The replica CCO current generator 106, the replica ring CCO 108, and the buffer 110 will be explained in more detail with reference to FIG. 3.

Figure 2:
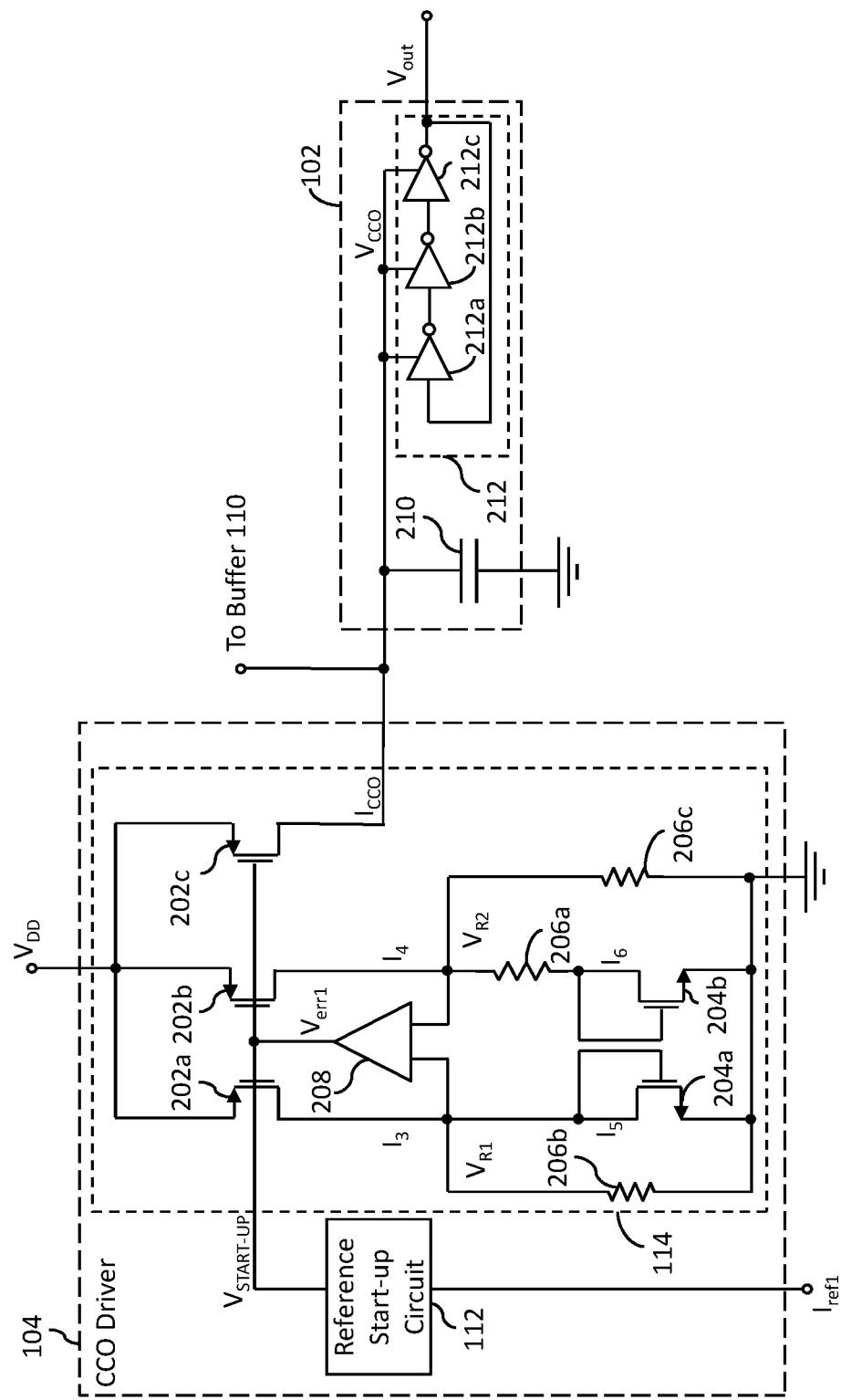
FIG. 2 is a schematic circuit diagram of a CCO driver connected to the ring CCO of FIG. 1 in accordance with an embodiment of the present invention.

Referring now to FIG. 2, a schematic circuit diagram of the ring CCO 102 and the CCO driver 104, in accordance with an embodiment of the present invention, is shown. The CCO driver 104 includes the reference start-up circuit 112 and the first current source 114. The first current source 114 includes first through fifth transistors 202a, 202b, 202c and 204a and 204b, first through third resistors 206a-206c, and a first amplifier 208. In one embodiment, the first through third transistors 202a-202c are p-channel metal oxide semiconductor (PMOS) transistors, and the fourth and fifth transistors 204a and 204b are n-channel (N) MOS transistors.

The first transistor 202a has a source terminal that receives the supply voltage $V_{DD}$ from a voltage source, and a gate terminal connected to the reference start-up circuit 112 for receiving the start-up voltage $V_{START-UP}$. The second transistor 202b has a source terminal that receives the supply voltage $V_{DD}$, and a gate terminal connected to the reference start-up circuit 112 for receiving the start-up voltage $V_{START-UP}$. The third transistor 202c has a source terminal that receives the supply voltage $V_{DD}$, a gate terminal connected to the reference start-up circuit 112 for receiving the start-up voltage $V_{START-UP}$, and a drain terminal that provides the CCO current $I_{CCO}$. The fourth transistor 204a has a source terminal connected to ground, a drain terminal connected to a drain terminal of the first transistor 202a, and a gate terminal connected to the drain terminal of the fourth transistor 204a. The fifth transistor 204b has a source terminal connected to ground, a drain terminal connected to a drain terminal of the second transistor 202b by way of the first resistor 206a, and a gate terminal connected to the drain terminal of the fifth transistor 204b. The second resistor 206b is connected across the fourth transistor 204a, and the third resistor 206c is connected across the first resistor 206a and the fifth transistor 204b.

The first amplifier 208 has first and second input terminals connected to the drain terminals of the first and second transistors 202a and 202b, respectively, and an output terminal connected to the gate terminal of the first transistor 202a. The reference start-up circuit 112 outputs the start-up voltage $V_{START\_UP}$ to the gate terminals of the first through third transistors 202a-202c, causing the first through third transistors 202a-202c to generate the third and fourth currents $I_3$ and $I_4$, and the CCO current $I_{CCO}$, respectively. Based on the third and fourth currents $I_3$ and $I_4$, and the resistance values of the second and third resistors 206b and 206c, fifth and sixth currents $I_5$ and $I_6$ flow through the fourth and fifth transistors 204a and 204b, respectively. The first and second resistor voltages $V_{R1}$ and $V_{R2}$ are generated across the second and third resistors 206b and 206c, respectively. The third and fourth currents $I_3$ and $I_4$ are given by equations (1) and (2):

$$I_3 = I_5 + V_{R1}/R_1 \quad (1)$$

$$I_4 = I_6 + V_{R2}/R_2 \quad (2)$$

where, $R_1$ and $R_2$ are resistance values of the second and third resistors 206b and 206c, respectively.

The first and second input terminals of the first amplifier 208 receive the first and second resistor voltages $V_{R1}$ and $V_{R2}$, respectively. The first amplifier 208 compares the first and second resistor voltages $V_{R1}$ and $V_{R2}$, and generates a first error voltage $V_{err1}$ by amplifying a difference between the first and second resistor voltages $V_{R1}$ and $V_{R2}$. The first amplifier 208 further outputs the first error voltage $V_{err1}$ to the gate terminals of the first through third transistors 202a-202c. The third transistor 202c regulates the CCO current $I_{CCO}$ based on the first error voltage $V_{err1}$.

The reference start-up circuit 112 generates the start-up voltage $V_{START-UP}$ and pulls down the first and second transistors 202a and 202b to ground when the reference start-up circuit 112 is turned ON. Based on the start-up voltage $V_{START-UP}$, the third transistor 202c outputs the CCO current $I_{CCO}$ at its drain terminal. Since the first and second transistors 202a and 202b are pulled down to ground, the fifth and sixth currents $I_5$ and $I_6$ increase until the fifth and sixth currents $I_5$ and $I_6$ become equal to the first reference current $I_{ref1}$, at which point the reference start-up circuit 112 pulls up the first through third transistors 202a-202c to the supply voltage $V_{DD}$. When the first through third transistors 202a-202c are pulled up to the supply voltage $V_{DD}$, the first amplifier 208 generates the first error voltage $V_{err1}$ such that the third transistor 202c controls the CCO current $I_{CCO}$ based on the first error voltage $V_{err1}$.

The ring CCO 102 includes a capacitor 210 and a first inverter chain 212. The capacitor 210 is connected between the buffer 110 and ground. The first inverter chain 212 includes first through third series connected inverters 212a-212c. Control terminals of each of the first through third inverters 212a-212c are connected to the CCO driver 104 to receive the CCO current $I_{CCO}$. The buffer 110 maintains the control terminals of each of the first through third inverters 212a-212c at the CCO voltage $V_{CCO}$. Based on the CCO voltage $V_{CCO}$ and the CCO current $I_{CCO}$, the first inverter chain 212 generates the CCO output voltage $V_{out}$ at the first oscillating frequency, which is directly proportional to the CCO current $I_{CCO}$. When the CCO current $I_{CCO}$ increases, the first oscillating frequency increases, and when the CCO current $I_{CCO}$ decreases, the first oscillating frequency decreases.

Figure 3:
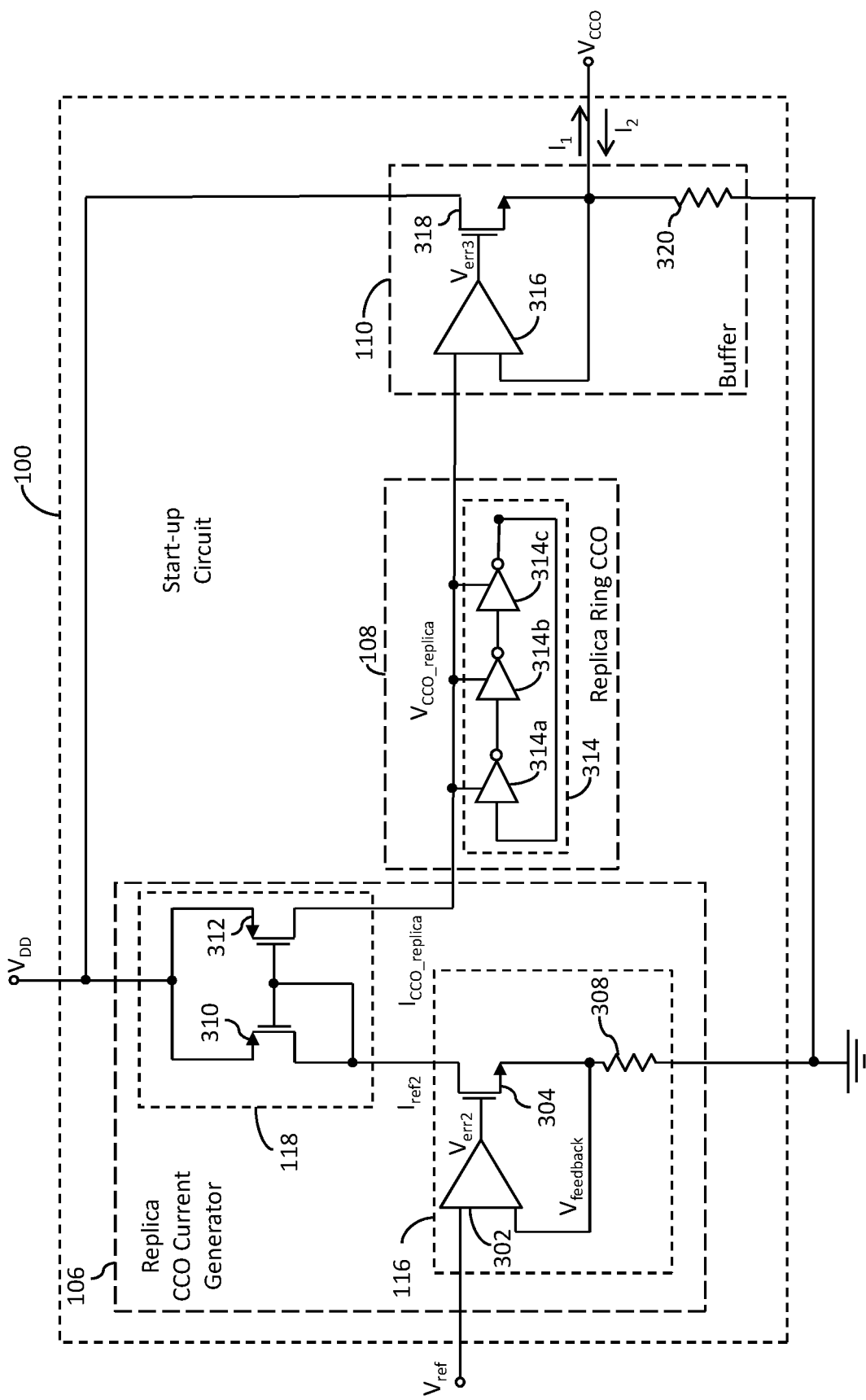
FIG. 3 is a schematic circuit diagram of the start-up circuit of FIG. 1 in accordance with an embodiment of the present invention.

Referring now to FIG. 3, a schematic circuit diagram of the start-up circuit 100 in accordance with an embodiment of the present invention is shown. The replica CCO current generator 106 includes the second current source 116 and the current mirror 118. The second current source 116 includes a second amplifier 302, a sixth transistor 304, and a fourth resistor 308. The current mirror 118 includes seventh and eighth transistors 310 and 312. The replica CCO current generator 106 receives the reference voltage $V_{ref}$ and the supply voltage $V_{DD}$, and generates the replica CCO current $I_{CCO\_replica}$, where the replica CCO current $I_{CCO\_replica}$ is less than the CCO current $I_{CCO}$. The second amplifier 302 has first and second input terminals that receive the reference voltage $V_{ref}$ and a feedback voltage $V_{feedback}$, respectively. The second amplifier 302 amplifies the difference between the reference voltage $V_{ref}$ and the feedback voltage $V_{feedback}$, and outputs a second error voltage $V_{err2}$ at an output terminal thereof.

The sixth transistor 304 has a gate terminal connected to the output terminal of the second amplifier 302 for receiving the second error voltage $V_{err2}$, a source terminal connected to the second input terminal of the second amplifier 302, and a drain terminal that generates the second reference current $I_{ref2}$. The fourth resistor 308 is connected between the source terminal of the sixth transistor 304 and ground. The second error voltage $V_{err2}$ controls the operation of the sixth transistor 304. The feedback voltage $V_{feedback}$ is given by the equation (3):

$$V_{feedback1} = I_{ref2} \times R_3 \quad (3)$$

where, $R_3$ is a resistance value of the fourth resistor 308. Hence, the second amplifier 302 controls the second reference current $I_{ref2}$ based on the feedback voltage $V_{feedback}$.

The seventh transistor 310 has a source terminal that receives the supply voltage $V_{DD}$, and a gate terminal that is connected to a drain terminal thereof for receiving the second reference current $I_{ref2}$. The eighth transistor 312 has a source terminal that receives the supply voltage $V_{DD}$, a gate terminal connected to the gate terminal of the seventh transistor 310, and a drain terminal that generates the replica CCO current $I_{CCO\_replica}$. The current mirror 118 mirrors the second reference current $I_{ref2}$ and generates the replica CCO current $I_{CCO\_replica}$ such that the replica CCO current $I_{CCO\_replica}$ has the same value as that of the second reference current $I_{ref2}$, and which is less than the CCO current $I_{CCO}$. In one scenario, the replica CCO current $I_{CCO\_replica}$ is 0.8 times the CCO current $I_{CCO}$ and is given by equation (4):

$$I_{CCO\_replica} = I_{CCO} \times 0.8 \quad (4)$$

The replica ring CCO 108 includes a second inverter chain 314 that is connected to the replica CCO current generator 106 for receiving the replica CCO current $I_{CCO\_replica}$. The second inverter chain 314 preferably comprises an odd number of series connected inverters. In one embodiment, the second inverter chain 314 includes fourth through sixth inverters 314a-314c, where the output of the sixth inverter 314c is connected to the input of the fourth inverter 314c. Control terminals of the fourth through sixth inverters 314a-314c are connected to the current mirror 118 for receiving the replica CCO current $I_{CCO\_replica}$. The buffer 110 maintains the control terminals of each of the fourth through sixth inverters 314a-314c at a replica CCO voltage $V_{CCO\_replica}$. The second inverter chain 314 generates the replica CCO output voltage $V_{out\_replica}$ at the second oscillating frequency based on the replica CCO current $I_{CCO\_replica}$, where the second oscillating frequency is directly proportional to the replica CCO current $I_{CCO\_replica}$. When the replica CCO current $I_{CCO\_replica}$ increases, the second oscillating frequency increases, and when the replica CCO current $I_{CCO\_replica}$ decreases, the second oscillating frequency decreases.

For example, if the first oscillating frequency is lower than the desired oscillating frequency of the CCO output voltage $V_{out}$, then as the first oscillating frequency is directly proportional to the CCO current $I_{CCO}$, the buffer 110 provides the first current $I_1$ to the ring CCO 102 to increase the CCO current $I_{CCO}$ such that the first oscillating frequency increases to the desired oscillating frequency. In another example, if the first oscillating frequency is greater than the desired oscillating frequency, then the buffer 110 drains the second current $I_2$ from the ring CCO 102 to reduce the CCO current $I_{CCO}$ such that the first oscillating frequency is reduced to the desired oscillating frequency. In one embodiment, the buffer 110 includes a third amplifier 316, a ninth transistor 318, and a fifth resistor 320.

A first input terminal of the third amplifier 316 is connected to the control terminals of the fourth through sixth inverters 314a-314c for receiving the replica CCO voltage $V_{CCO\_replica}$. A second input terminal of the third amplifier 316 is connected to the fifth resistor 320 and the control terminals of the first through third inverters 212a-212c for receiving the CCO voltage $V_{CCO}$. The third amplifier 316 compares the replica CCO voltage $V_{CCO\_replica}$ with the CCO voltage $V_{CCO}$, and amplifies a difference between the replica CCO voltage $V_{CCO\_replica}$ and the CCO voltage $V_{CCO}$ to output a third error voltage $V_{err3}$ at an output terminal thereof.

The ninth transistor 318 has a gate terminal connected to the output terminal of the third amplifier 316 for receiving the third error voltage $V_{err3}$, a source terminal connected to the fifth resistor 320 and the control terminals of the first through third inverters 212a-212c for receiving the CCO voltage $V_{CCO}$, and a drain terminal that receives the supply voltage $V_{DD}$. Based on the CCO current $I_{CCO}$ and a resistance value of the fifth resistor 320, the third amplifier 316 receives the CCO voltage $V_{CCO}$ at the second input terminal thereof. Hence, the ninth transistor 318 generates the first current $I_1$ and drains the second current $I_2$ at the source terminal thereof based on the third error voltage $V_{err3}$. Thus, the buffer 110 controls the first oscillating frequency of the CCO output voltage $V_{out}$ by either providing the first current $I_1$ or draining the second current $I_2$ from the ring CCO 102. The start-up circuit 100 is turned OFF when the ring CCO 102 generates the CCO output voltage $V_{out}$ at the desired oscillating frequency, i.e., when the first oscillating frequency is equal to the desired oscillating frequency. The time after which the ring CCO 102 generates the CCO output voltage $V_{out}$ at the desired oscillating frequency after turning OFF is a settling time of the ring CCO 102.

The settling time $T_{CCO}$ of the ring CCO 102 is given by equation (5):

$$T_{CCO} = 3 \times R_{CCO} \times C_{CCO} \quad (5)$$

where, $R_{CCO}$ and $C_{CCO}$ are a total shunt resistance and a total shunt capacitance, respectively, of the ring CCO 102. In one embodiment, the total shunt resistance $R_{CCO}$ is 50 kilo-ohm (kΩ), and the total shunt capacitance $C_{CCO}$ is 50 pico-farads (pF). Hence, the settling time of the ring CCO 102 is 7.5 microseconds. In this embodiment, a total shunt resistance of the replica ring CCO 108 is 50 kΩ, and a total shunt capacitance of the replica ring CCO 108 is 0.1 pF. Hence, the settling time $T_{R\_CCO}$ of the replica ring CCO 108 is given by equation (6):

$$T_{R\_CCO} = 3 \times 50 \text{ k}\Omega \times 0.1 \text{ pF} = 150 \text{ nSec} \quad (6)$$

The buffer 110 has a gain bandwidth of 2 megaHertz (MHz). Hence, a settling time $T_{Buffer}$ of the buffer 110 is given by equation (7):

$$T_{Buffer} = 3/\text{gain bandwidth} = 3/2 \text{ MHz} = 1.5 \text{ mSec} \quad (7)$$

Hence, the settling times of the buffer 110 and the replica ring CCO 108 together are less than the settling time of the ring CCO 102. Hence, the buffer 110 and the replica ring CCO 108 facilitate a fast start-up time of the ring CCO 102.

In operation, the desired oscillating frequency of the ring CCO 102 is 200 MHz. The second current source 116 receives the reference voltage $V_{ref}$ at 1 Volt (V) Direct current (DC), and generates the second reference current $I_{ref2}$ at 0.008 Amperes (A). The current mirror 118 mirrors the second reference current $I_{ref2}$ and generates the replica CCO current $I_{CCO\_replica}$ at 0.008 A. The replica ring CCO 108 thus receives the replica CCO current $I_{CCO\_replica}$ at 0.008 A. The buffer 110 maintains voltage levels at each of the control terminals of the fourth through sixth inverters 314a-314c at 0.7 V DC, i.e., the replica CCO voltage $V_{CCO\_replica}$ is at 0.7 V DC. Based on the replica CCO current $I_{CCO\_replica}$ and the replica CCO voltage $V_{CCO\_replica}$, the replica ring CCO 108 generates the replica CCO output voltage $V_{out\_replica}$ at the second oscillating frequency of 180 MHz.

The CCO driver 104 generates the CCO current $I_{CCO}$ at 0.010 A and outputs the CCO current $I_{CCO}$ to the ring CCO 102. The buffer 110 maintains voltage levels at the control terminals of the first through third inverters 212a-212c at 0.75 V DC, i.e., increases the CCO voltage $V_{CCO}$ from 0.7 V to 0.75 V DC. In one scenario, the ring CCO 102 generates the CCO output voltage $V_{out}$ at the first oscillating frequency of 190 MHz. Hence, the buffer 110 provides the first current $I_1$ to the ring CCO 102 such that the first oscillating frequency is achieved at 200 MHz. In another scenario, the ring CCO 102 generates the CCO output voltage $V_{out}$ at the first oscillating frequency of 210 MHz. Then, the buffer 110 drains the second current $I_2$ from the ring CCO 102 and achieves the first oscillating frequency at 200 MHz. It will be apparent to a person skilled in the art that the reference voltage $V_{ref}$, the second reference current $I_{ref2}$, the CCO current $I_{CCO}$, the replica CCO current $I_{CCO\_replica}$, the CCO voltage $V_{CCO}$, the replica CCO voltage $V_{CCO\_replica}$, the first and second oscillating frequencies, and the desired oscillating frequency may have different values than presented in the aforementioned description.

The replica CCO current generator 106 generates the replica CCO current $I_{CCO\_replica}$ at a value that is less than the CCO current $I_{CCO}$. The buffer 110 regulates the CCO current $I_{CCO}$ to prevent the ring CCO 102 from shutting down. The buffer 110 further maintains the control terminals of the first through third inverters 212a-212c at the CCO voltage $V_{CCO}$ and the control terminals of the fourth through sixth inverters 314a-314c at the replica CCO voltage $V_{CCO\_replica}$. This helps the buffer 110 provide the first current $I_1$ to the ring CCO 102 when the first oscillating frequency is lower than the desired oscillating frequency, and drain the second current $I_2$ from the ring CCO 102 when the first oscillating frequency is greater the desired oscillating frequency. Hence, the ring CCO 102 maintains the CCO current $I_{CCO}$ at a value that facilitates maintaining the first oscillating frequency at the desired oscillating frequency.

The start-up circuit 100 also is low power because the start-up circuit 100 is turned OFF once the ring CCO 102 starts oscillating at the desired oscillating frequency. The settling times of the buffer 110 and the replica ring CCO 108 together are less than the settling time of the ring CCO 102, which facilitates the fast start-up time of the ring CCO 102 and prevents the first oscillating frequency from increasing beyond the desired oscillating frequency.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A start-up circuit for a ring current-controlled oscillator (CCO), wherein the ring CCO receives a CCO current, the startup circuit comprising:
    a replica CCO current generator that receives a reference voltage and a supply voltage, and generates a replica CCO current;
    a replica ring CCO connected to the replica CCO current generator for receiving the replica CCO current, wherein the replica ring CCO generates a replica CCO output voltage at a first oscillating frequency that is less than a second oscillating frequency of a CCO output voltage of the ring CCO; and
    a buffer, connected to the ring CCO and the replica ring CCO, wherein the buffer provides a first current to the ring CCO when the second oscillating frequency is lower than a desired oscillating frequency of the CCO output voltage, and drains a second current from the ring CCO when the second oscillating frequency is greater than the desired oscillating frequency.

2. The start-up circuit of claim 1, wherein the replica CCO current generator comprises:
    a current source that receives the reference voltage and generates a reference current; and
    a current mirror that receives the reference current from the current source, and the supply voltage, and generates the replica CCO current.

3. The start-up circuit of claim 2, wherein the current source comprises:
    an amplifier having a first input terminal that receives the reference voltage, a second input terminal that receives a feedback voltage, and an output terminal that provides an error voltage; and
    a transistor having a gate terminal connected to the output terminal of the amplifier for receiving the error voltage, a source terminal connected to the second input terminal of the amplifier for providing the feedback voltage thereto, and a drain terminal that provides the reference current.

4. The start-up circuit of claim 2, wherein the current mirror comprises:
    a first transistor having a source terminal that receives the supply voltage, and a gate terminal connected to a drain terminal thereof for receiving the reference current; and
    a second transistor having a source terminal that receives the supply voltage, a gate terminal connected to the gate terminal of the first transistor, and a drain terminal that provides the replica CCO current.

5. The start-up circuit of claim 1, wherein the replica ring CCO comprises an inverter chain connected between the replica CCO current generator and the buffer, wherein the inverter chain receives the replica CCO current and generates the replica CCO output voltage.

6. The start-up circuit of claim 5, wherein the inverter chain comprises an odd number of inverters connected in series, wherein a first inverter in said series is connected to an output of the last inverter in said series for receiving replica CCO output voltage, and each of the inverters in said chain receives the replica CCO current at a respective control terminal thereof.

7. The start-up circuit of claim 1, wherein the buffer comprises:
    an amplifier having a first input terminal that receives the replica CCO current, a second input terminal that receives a feedback voltage, and an output terminal that provides an error voltage; and
    a transistor having a gate terminal connected to the output terminal of the amplifier for receiving the error voltage, a drain terminal that receives the supply voltage, and a source terminal connected to the second input terminal of the amplifier for providing the feedback voltage thereto, wherein the first current is generated at the source terminal of the transistor, and the second current is drained to the source terminal of the transistor.

8. A system for generating a current-controlled oscillator (CCO) output voltage at a first oscillating frequency, the system comprising:
    a ring CCO connected to a first node for receiving a CCO current, wherein the ring CCO generates the CCO output voltage at the first oscillating frequency;
    a CCO driver connected to the ring CCO by way of the first node, wherein the CCO driver receives a supply voltage and a first reference current, and provides the CCO current at the first node; and
    a start-up circuit that receives a reference voltage and the supply voltage, and wherein the start-up circuit controls the first oscillating frequency of the CCO output voltage by providing a first current at the first node when the first oscillating frequency is lower than a desired oscillating frequency of the CCO output voltage, and drains a second current from the first node when the first oscillating frequency is greater than the desired oscillating frequency.

9. The system of claim 8, wherein the ring CCO comprises:
    a capacitor connected between the first node and ground; and
    a first inverter chain, connected to the first node, that receives the CCO current, and generates the CCO output voltage at the first oscillating frequency.

10. The system of claim 9, wherein:
    the first inverter chain comprises an odd number of inverters connected in series,
    an output of the last inverter in the series is connected to an input of the first inverter in the series,
    control terminals of the inverters are connected to the first node and receive the CCO current, and
    the CCO output voltage is provided at the output of the last inverter in the series.

11. The system of claim 8, wherein the CCO driver comprises:
    a reference start-up circuit that receives the first reference current, and generates a start-up voltage; and
    a first current source that receives the supply voltage and is connected to the reference start-up circuit for receiving the start-up voltage, wherein the first current source generates the CCO current using the start-up voltage.

12. The system of claim 11, wherein the first current source comprises:
- a first transistor having a source terminal that receives the supply voltage, a gate terminal connected to the reference start-up circuit for receiving the start-up voltage, and a drain terminal for generating a third current;
- a second transistor having a source terminal that receives the supply voltage, a gate terminal connected to the reference start-up circuit for receiving the start-up voltage, and a drain terminal for generating a fourth current;
- a third transistor having a source terminal that receives the supply voltage, a gate terminal connected to the reference start-up circuit for receiving the start-up voltage, and a drain terminal that generates the CCO current; and
- a first amplifier that has first and second input terminals connected to the drain terminals of the first and second transistors, and an output terminal that generates an error voltage, wherein the error voltage is provided to the gate terminals of the first through third transistors, and wherein the third transistor regulates the CCO current based on the error voltage.

13. The system of claim 12, wherein the current source further comprises:
- a fourth transistor having a source terminal connected to ground, a drain terminal connected to the drain terminal of the first transistor, and a gate terminal connected to its drain terminal;
- a fifth transistor having a source terminal connected to ground, a drain terminal connected to the drain terminal of the second transistor by way of a first resistor, and a gate terminal connected to its drain terminal;
- a second resistor connected between the source and drain terminals of the fourth transistor; and
- a third resistor connected between the drain of the second transistor and the first resistor, and ground.

14. The system of claim 8, wherein the start-up circuit comprises:
- a replica CCO current generator that receives the reference voltage and the supply voltage, and generates a replica CCO current;
- a replica ring CCO connected to the replica CCO current generator for receiving the replica CCO current, wherein the replica ring CCO generates a replica CCO output voltage at a second oscillating frequency that is less than the first oscillating frequency of the CCO output voltage; and
- a buffer, connected to the replica ring CCO for receiving the replica CCO output voltage, and to the ring CCO by way of the first node, wherein the buffer provides the first current to the ring CCO when the first oscillating frequency is lower than a desired oscillating frequency of the CCO output voltage, and drains a second current from the ring CCO when the first oscillating frequency is greater than the desired oscillating frequency.

15. The system of claim 14, wherein the replica CCO current generator comprises:
- a current source that receives the reference voltage and generates a second reference current; and
- a current mirror that receives the second reference current from the current source, and the supply voltage, and generates the replica CCO current.

16. The system of claim 15, wherein the current source comprises:
- an amplifier having a first input terminal that receives the reference voltage, a second input terminal that receives a feedback voltage, and an output terminal that provides an error voltage; and
- a transistor having a gate terminal connected to the output terminal of the amplifier for receiving the error voltage, a source terminal connected to the second input terminal of the amplifier for providing the feedback voltage thereto, and a drain terminal that provides the second reference current.

17. The system of claim 16, wherein the current mirror comprises:
- a first transistor having a source terminal that receives the supply voltage, and a gate terminal connected to a drain terminal thereof for receiving the second reference current; and
- a second transistor having a source terminal that receives the supply voltage, a gate terminal connected to the gate terminal of the first transistor, and a drain terminal that provides the replica CCO current.

18. The system of claim 14, wherein the replica ring CCO comprises an inverter chain connected between the replica CCO current generator and the buffer, wherein the inverter chain receives the replica CCO current and generates the replica CCO output voltage.

19. The system of claim 18, wherein the inverter chain comprises an odd number of inverters connected in series, wherein a first inverter in said series is connected to an output of the last inverter in said series for receiving replica CCO output voltage, and each of the inverters in said chain receives the replica CCO current at a respective control terminal thereof.

20. The system of claim 14, wherein the buffer comprises:
- an amplifier having a first input terminal that receives the replica CCO current, a second input terminal that receives a feedback voltage, and an output terminal that provides an error voltage; and
- a transistor having a gate terminal connected to the output terminal of the amplifier for receiving the error voltage, a drain terminal that receives the supply voltage, and a source terminal connected to the second input terminal of the amplifier for providing the feedback voltage thereto, wherein the first current is generated at the source terminal of the transistor, and the second current is drained to the source terminal of the transistor.

* * * * *